(12) United States Patent
Bucher (10) Patent No.: US 9,924,615 B2
(45) Date of Patent: Mar. 20, 2018

(54) RECEPTACLE ASSEMBLY HAVING A HEAT EXCHANGER

(71) Applicant: TYCO ELECTRONICS CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/236,876

(22) Filed: Aug. 15, 2016

(65) Prior Publication Data

US 2018/0049348 A1    Feb. 15, 2018

(51) Int. Cl.
| | |
|---|---|
| H05K 7/20 | (2006.01) |
| G02B 6/42 | (2006.01) |
| H01R 24/64 | (2011.01) |
| H01R 25/00 | (2006.01) |
| H01R 13/6581 | (2011.01) |
| H01R 24/28 | (2011.01) |
| H01R 107/00 | (2006.01) |

(52) U.S. Cl.
CPC ....... *H05K 7/20418* (2013.01); *G02B 6/4266* (2013.01); *G02B 6/4269* (2013.01); *H01R 13/6581* (2013.01); *H01R 24/28* (2013.01); *H01R 24/64* (2013.01); *H01R 25/006* (2013.01); *H05K 7/20445* (2013.01); *H01R 2107/00* (2013.01)

(58) Field of Classification Search
CPC ........... H05K 7/20418; H05K 7/20436; H05K 7/20445; G02B 6/4266; G02B 6/4269; H01R 13/6581; H01R 24/28; H01R 24/64; H01R 25/006; H01R 2107/00
USPC ...................... 361/679.46–679.54, 688–723; 165/80.1–80.2, 185; 385/92; 362/580
See application file for complete search history.

(56) References Cited

U.S. PATENT DOCUMENTS

| | | | |
|---|---|---|---|
| 6,816,376 B2 | 11/2004 | Bright et al. | |
| 7,625,223 B1 | 12/2009 | Fogg | |
| 9,389,368 B1 * | 7/2016 | Sharf | H01R 27/00 |
| 9,402,332 B2 * | 7/2016 | McKervey | H05K 7/20009 |
| 2013/0210269 A1 * | 8/2013 | Neer | G02B 6/4246 439/487 |

* cited by examiner

*Primary Examiner* — Zachary M Pape (57) ABSTRACT

A receptacle assembly includes a receptacle housing having a module cavity defined by a top wall having a plurality of apertures therethrough. The module cavity has a port at a front end of the receptacle housing configured to receive a pluggable module. A communication connector is positioned in the receptacle housing having a mating interface for mating with the pluggable module. A heat exchanger is received in the module cavity having a heat spreader positioned interior of the module cavity below the top wall. The heat spreader is configured to be in thermal communication with the pluggable module. The heat exchanger has a plurality of fin segments extending from the heat spreader. The fin segments are received in corresponding apertures in the top wall to pass through the top wall to an exterior of the module cavity for heat dissipation.

20 Claims, 4 Drawing Sheets

RECEPTACLE ASSEMBLY HAVING A HEAT EXCHANGER

BACKGROUND OF THE INVENTION

The subject matter described herein relates to a receptacle assembly that receives a pluggable module in a communication system.

At least some known communication systems include receptacle assemblies, such as input/output (I/O) connector assemblies, that are configured to receive a pluggable module and establish a communicative connection between the pluggable module and an electrical connector of the receptacle assembly. As one example, a known receptacle assembly includes a receptacle housing that is mounted to a circuit board and configured to receive a small form-factor (SFP) pluggable transceiver. The receptacle assembly includes an elongated cavity that extends between an opening of the cavity and an electrical connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection.

A challenge often encountered in the design of the pluggable module and receptacle assembly is the heat generated during operation of the communication system, which negatively affects module/system reliability and electrical performance. Typically, heat is generated by components on the internal circuit board within the pluggable module and drawn away from the internal circuit board by the metal body of the pluggable module. In some cases, a heat sink is used to dissipate heat from the pluggable module. In conventional receptacle assemblies, the top of the receptacle housing includes a large opening. The heat sink covers the opening and is retained on the receptacle housing by a spring clip. A portion of the heat sink extends through the opening and engages the pluggable module. The large opening in the top of the housing is a leak point for electromagnetic interference (EMI). Some receptacle assemblies mitigate EMI leakage with additional gaskets at the opening, which adds to the overall cost of the receptacle assembly.

Accordingly, there is a need to provide cost-effective EMI shielding at the interface between a heat exchanger and the housing of a receptacle assembly.

BRIEF DESCRIPTION OF THE INVENTION

In an embodiment, a receptacle assembly is provided including a receptacle housing having a module cavity defined by a top wall and opposed side walls extending to a bottom opposite the top wall. The top wall has a plurality of apertures therethrough. The module cavity has a port at a front end of the receptacle housing configured to receive a pluggable module. A communication connector is positioned in the receptacle housing having a mating interface for mating with the pluggable module. A heat exchanger is received in the module cavity having a heat spreader positioned interior of the module cavity below the top wall. The heat spreader is configured to be in thermal communication with the pluggable module. The heat exchanger has a plurality of fin segments extending from the heat spreader. The fin segments are received in corresponding apertures in the top wall to pass through the top wall to an exterior of the module cavity for heat dissipation.

In another embodiment, a receptacle assembly is provided including a receptacle housing having first and second module cavities defined by a top wall and separated by a dividing wall. The top wall has a plurality of apertures therethrough defined by aperture edges. The first and second module cavities have ports at a front end of the receptacle housing configured to receive corresponding pluggable modules. First and second heat exchangers are received in the first and second module cavities, respectively. Each of the first and second heat exchangers have a heat spreader positioned interior of the corresponding module cavity and configured to be in thermal communication with the corresponding pluggable module. Each of the first and second heat exchangers have a plurality of fin segments extending from the heat spreader received in corresponding apertures in the top wall to pass through the top wall to an exterior of the corresponding module cavity for heat dissipation. The apertures are oversized relative to the fin segments to allow a limited amount of floating movement of the first and second heat exchangers relative to the receptacle housing such that the first and second heat exchangers are movable independent relative to each other.

In a further embodiment, a communication system is provided including a pluggable module having a pluggable body extending between a mating end and a cable end. The pluggable module has a circuit card at the mating end. The pluggable body is thermally conductive and in thermal communication with the circuit card to dissipate heat from the circuit card. The communication system includes a receptacle assembly receiving the pluggable module. The receptacle assembly has a receptacle housing holding a communication connector for mating with the pluggable module. The receptacle housing has a module cavity defined by a top wall having a plurality of apertures therethrough defined by aperture edges. The module cavity has a port at a front end of the receptacle housing receiving the pluggable module. A heat exchanger is received in the module cavity. The heat exchanger has a heat spreader positioned interior of the module cavity. The heat spreader is in thermal communication with the pluggable module. The heat exchanger has a plurality of fin segments extending from the heat spreader. The fin segments are received in corresponding apertures in the top wall to pass through the top wall to an exterior of the module cavity for heat dissipation. The apertures receive the fin segments such that gaps are defined between the fin segments and the aperture edges.

DETAILED DESCRIPTION OF THE INVENTION

Embodiments set forth herein include communication systems having heat exchangers for dissipating heat from pluggable modules. Various embodiments described herein include receptacle assemblies having heat exchangers for dissipating heat from pluggable modules while providing efficient EMI shielding at the heat exchanger. For example, in an exemplary embodiment, openings in the cage or receptacle housing are small to control EMI shielding.

Figure 1:
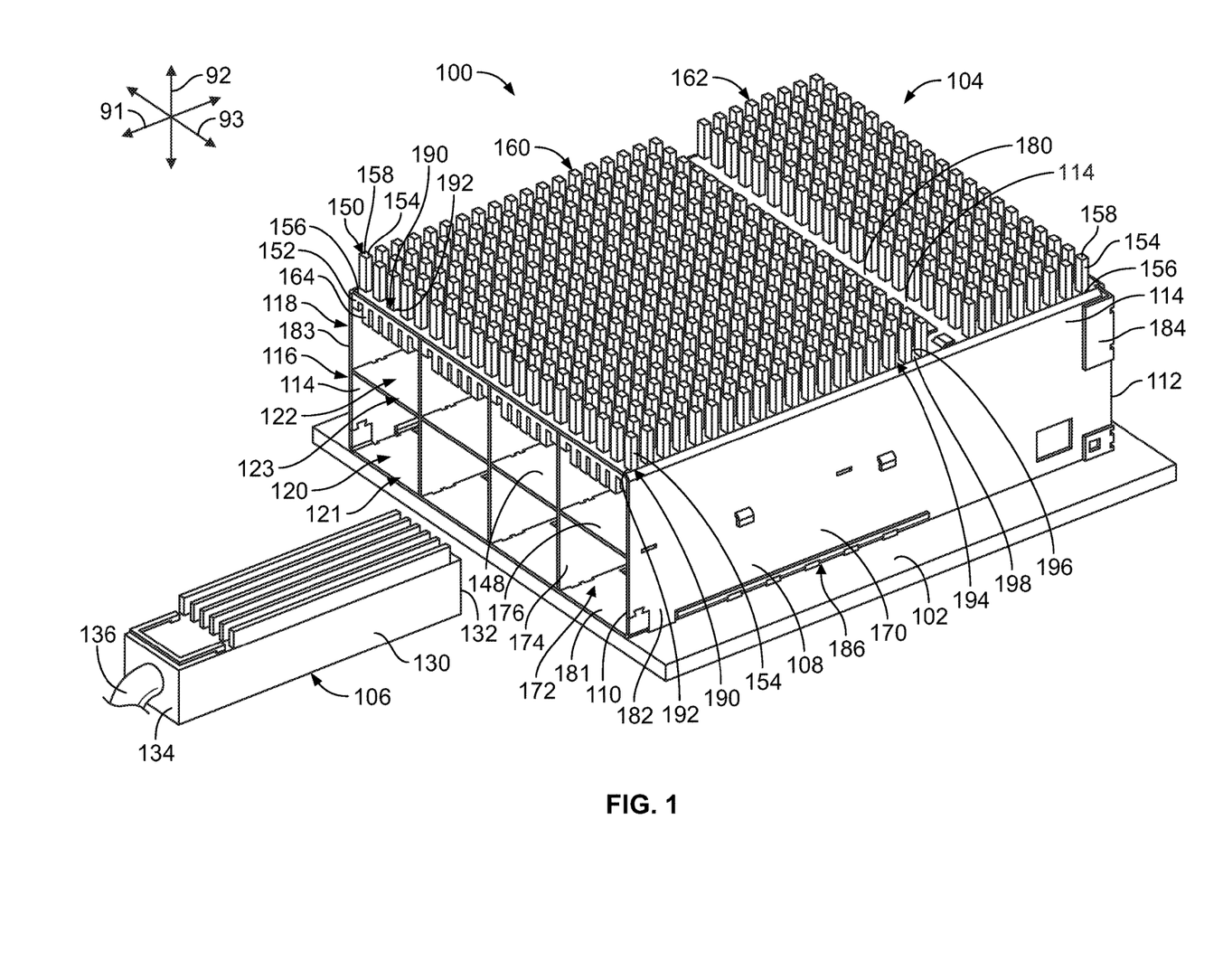
FIG. 1 is a front perspective view of a communication system having a receptacle assembly in accordance with an embodiment.
Figure 2:
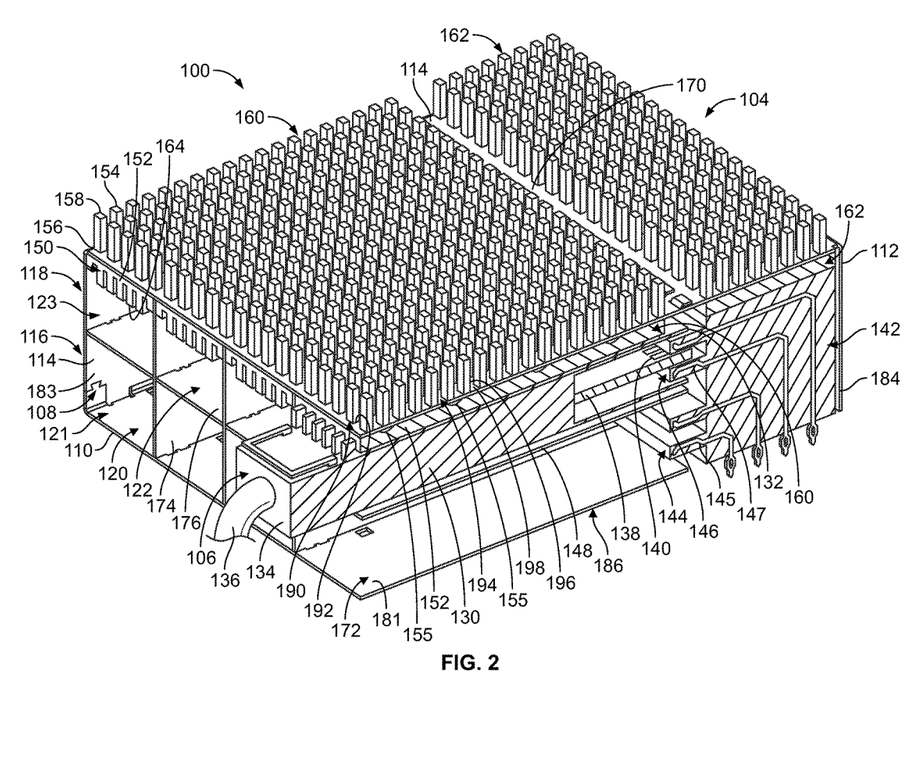
FIG. 2 is a perspective, cross-sectional view of the communication system.

FIG. 1 is a front perspective view of a communication system 100 in accordance with an embodiment. FIG. 2 is a perspective, cross-sectional view of the communication system 100. The communication system 100 includes a circuit board 102, a receptacle assembly 104 mounted to the circuit board 102, and one or more pluggable modules 106 that are configured to communicatively engage the receptacle assembly 104. The receptacle assembly 104 is illustrated as a stacked and ganged receptacle assembly 104 configured to receive multiple pluggable modules 106 in stacked and ganged arrangements. While only one pluggable module 106 is shown in FIG. 1, it is understood that multiple pluggable modules 106 may simultaneously engage the receptacle assembly 104.

The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. For example, the circuit board 102 may be oriented vertically, horizontally, or in another orientation.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The receptacle assembly 104 includes a receptacle housing 108 that is mounted to the circuit board 102. The receptacle housing 108 may also be referred to as a receptacle cage. The receptacle housing 108 may be arranged at a bezel or faceplate (not shown) of a chassis of the system or device, such as through an opening in the faceplate. As such, the receptacle housing 108 is interior of the device and corresponding faceplate and the pluggable module(s) 106 is loaded into the receptacle housing 108 from outside or exterior of the device and corresponding faceplate. In the illustrated embodiment, the receptacle assembly 104 is provided with heat exchangers 150 for dissipating heat from the pluggable modules 106.

The receptacle housing 108 includes a front end 110 and an opposite back end 112. The front end 110 may be provided at, and extend through an opening in, the faceplate. The mating axis 91 may extend between the front and back ends 110, 112. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104. In other examples, the top and bottom may be referenced to the circuit board 102 with the bottom positioned closer to the circuit board and the top positioned further from the circuit board. The top may be positioned below the bottom in some orientations and the top and bottom may be vertically aligned in some orientations, such as when the circuit board 102 is oriented vertically as opposed to horizontally.

The receptacle housing 108 is configured to contain or block electromagnetic interference (EMI) and guide the pluggable module(s) 106 during a mating operation. To this end, the receptacle housing 108 includes a plurality of housing walls 114 that are interconnected with one another to form the receptacle housing 108. The housing walls 114 may be formed from a conductive material, such as sheet metal and/or a polymer having conductive particles. In the illustrated embodiment, the housing walls 114 are stamped and formed from sheet metal. In some embodiments, the receptacle housing 108 is configured to facilitate airflow through the receptacle housing 108 to transfer heat (or thermal energy) away from the receptacle assembly 104 and pluggable module(s) 106. For example, airflow openings may be provided in the housing walls 114 to allow airflow through the receptacle housing 108. The air may flow from inside the receptacle housing 108 to the external environment or from outside the receptacle housing 108 into the interior of the receptacle housing 108. Fans or other air moving devices may be used to increase airflow through the receptacle housing 108 and over the pluggable module(s) 106.

In the illustrated embodiment, the receptacle housing 108 includes a first (or bottom) row 116 of elongated module cavities 120 and a second (or top) row 118 of elongated module cavities 122. Each of the module cavities 120, 122 extends between the front and back ends 110, 112. The module cavities 120, 122 have respective port openings 121, 123 that are sized and shaped to receive a corresponding pluggable module 106. The module cavities 120, 122 may have the same or similar dimensions and extend lengthwise in a direction that is parallel to the mating axis 91. In the illustrated embodiment, each module cavity 122 is stacked over a corresponding module cavity 120 such that the module cavity 120 is positioned between the module cavity 122 and the circuit board 102; however the module cavities 122 may be provided in a single row without the module cavities 120 below in alternative embodiments. The module cavities 120, 122 are ganged together in any number of columns, including a single column. Any number of module cavities may be provided including a single module cavity.

Figure 3:
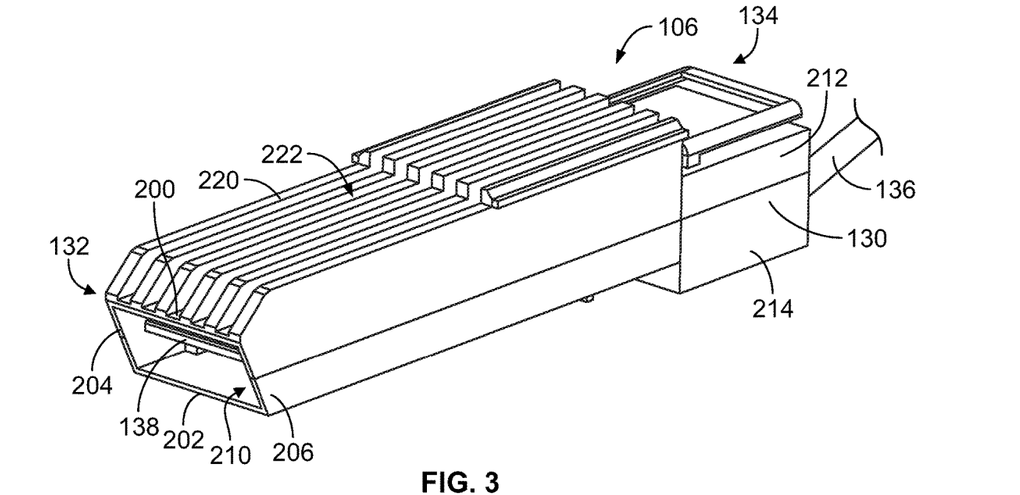
FIG. 3 is a front perspective view of a pluggable module of the communication system in accordance with an exemplary embodiment.

In some embodiments, the pluggable module 106 is an input/output cable assembly having a pluggable body 130. As shown in FIG. 3, the pluggable body 130 includes a mating end 132 and an opposite cable end 134. A cable 136 is coupled to the pluggable body 130 at the cable end 134. The pluggable body 130 also includes an internal circuit board 138 (FIG. 2) that is communicatively coupled to electrical wires or optical fibers (not shown) of the cable 136. The internal circuit board 138 includes contact pads 140 at the mating end 132. The mating end 132 is configured to be inserted into the module cavity 122 of the receptacle housing 108 and advanced in a mating direction along the mating axis 91. In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138.

The receptacle assembly 104 includes one or more communication connectors 142 (FIG. 2) configured for mating with corresponding pluggable modules 106. In the illustrated embodiment, each communication connector 142 has first and second mating interfaces 144, 146. The first mating interface 144 is disposed within the module cavity 120, and the second mating interface 146 is disposed within the module cavity 122. The first and second mating interfaces 144, 146 are aligned with the port openings 121, 123, respectively. Each of the first and second mating interfaces 144, 146 includes respective electrical contacts 145, 147 that are configured to directly engage the contact pads 140 of the pluggable module 106. Thus, a single communication connector 142 may mate with two pluggable modules 106.

In alternative embodiments, the receptacle assembly 104 does not include the stacked module cavities 120, 122 and, instead, includes only a single row of module cavities 120 or only a single module cavity 120. In such embodiments, the communication connector 142 may have a single row of mating interfaces or a single mating interface.

The pluggable module 106 is an input/output (I/O) module configured to be inserted into and removed from the receptacle assembly 104. In some embodiments, the pluggable module 106 is a small form-factor pluggable (SFP) transceiver or quad small form-factor pluggable (QSFP) transceiver. The pluggable module 106 may satisfy certain technical specifications for SFP or QSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, or more. By way of example, the receptacle assembly 104 and the pluggable module 106 may be similar to the receptacle cages and transceivers, respectively, which are part of the SFP+ product family available from TE Connectivity.

In various embodiments, the housing walls 114 of the receptacle housing 108 may optionally form a port separator 148 between the module cavities 120, 122. In the illustrated embodiment, the port separator 148 is a single wall or plate separating the module cavities 120, 122. The port separator 148 extends generally parallel to the mating axis 91 between the front end 110 and the back end 112. More specifically, the module cavity 120, the port separator 148, and the module cavity 122 are stacked along the elevation axis 92. In alternative embodiments, the port separator 148 may have two separating walls (shown in FIG. 5) separated by a gap between the upper and lower module cavities 120, 122. Optionally, a light-indicator assembly (not shown), such as a light pipe may be provided in the gap defined by the port separator 148. The gap may allow airflow between the module cavities 120, 122 to enhance heat transfer of the pluggable modules 106 located in the module cavities 120, 122. The gap may hold a heat exchanger configured to be in thermal communication with one or both of the pluggable modules 106 to dissipate heat therefrom. Alternatively, the heat exchanger may be received directly in the module cavity 120 or 122 to interface directly with the pluggable modules 106.

In an exemplary embodiment, the receptacle assembly 104 includes one or more of the heat exchangers 150. For example, each of the upper module cavities 122 includes one of the heat exchangers 150. Alternatively, a single heat exchanger 150 may be provided extending into each of the upper module cavities 122. Additionally or alternatively, the lower module cavities 122 may include heat exchangers 150. The heat exchangers 150 are manufactured from a thermally conductive material, such as a metal material. The heat exchangers 150 are configured to be in thermal communication with the pluggable modules 106. The heat exchangers 150 extend through one of the housing walls 114, such as through a top housing wall 180, to the exterior of the receptacle housing 108 and/or module cavity 120 for air cooling.

In an exemplary embodiment, the heat exchanger 150 includes a heat spreader 152 and a plurality of fin segments 154 extending from the heat spreader 152. The fin segments 154 may be integral with the heat spreader 152, such as co-molded with the heat spreader 152. The heat spreader 152 may be a generally planar plate positioned interior of the receptacle housing 108, such as in the module cavity 122. The heat spreader 152 may be positioned along an interior surface of a top housing wall. Optionally, a spring 155 (FIG. 2) may be provided between the heat exchanger 150 and the receptacle housing 108, such as between the heat spreader 152 and the top housing wall 180, to bias the heat exchanger 150 against the pluggable module 106.

The fin segments 154 extend from the top of the heat spreader 152 and are configured to pass through the top housing wall 180 to the exterior of the receptacle housing 108 and/or the module cavity 120. In the illustrated embodiment, the fin segments 154 are arranged in rows and in columns. The fin segments 154 may be air cooled by airflow over and along the fin segments 154. The fin segments 154 are spaced apart from each other to allow airflow in the spaces between the fin segments 154. In the illustrated embodiments, the fin segments 154 have a rectangular cross-section; however, other shapes are possible in alternative embodiments. For example, the fin segments 154 may have an elliptical shape. The fin segments 154 may be tapered. For example, the fin segments 154 may be wider at bases 156 of the fin segments 154 (for example, at the heat spreader 152) and narrower at tips 158 of the fin segments 154 (for example, at distal ends of the fin segments 154). The bases 156 are provided interior of the module cavity 120 and the tips 158 are provided exterior of the module cavity 120.

Optionally, each module cavity 122 may receive multiple heat exchangers 150. For example, each module cavity 122 may include a first heat exchanger 160 at or near the front end 110 and a second heat exchanger 162 at or near the back end 112. In alternative embodiments, a single heat exchanger 150 is provided in the module cavity 122 extending between the front end 110 and the back end 112.

In an exemplary embodiment, the heat exchanger 150 includes rails 164 extending from the bottom of the heat spreader 152 opposite the fin segments 154. The rails 164 are configured to engage the pluggable module 106. For example, the rails 164 may be interleaved with heat transfer fins of the pluggable module 106. The rails 164 may extend longitudinally, such as parallel to the insertion axis 91. The rails 164 may extend substantially the entire length of the pluggable module 106. The rails 164 may be integral with the heat spreader 152, such as co-molded with the heat spreader 152.

In some embodiments, the receptacle housing 108 is formed from a plurality of interconnected panels or sheets. For example, the receptacle housing 108 includes a main panel or shell 170 that surrounds a housing cavity 172, a plurality of interior panels 174, a base panel 181, and one or more separator panels 176 defining the port separator 148. Each of the main panel 170, the interior panels 174, and the separator panels 176 may be stamped and formed from sheet metal. As described in greater detail below, each of the main panel 170, the interior panels 174, and the separator panels 176 may form one or more of the housing walls 114 that define the module cavity 120, the module cavity 122, and the port separator 148. The main panel 170 includes a top wall 180, sidewalls 182, 183, and a back wall 184. The top wall 180 defines the top of the upper module cavity 122. The separator panel 176 may define a bottom or bottom wall of the module cavity 122. The separator panel 176 may define a top wall of the lower module cavity 120. The base panel 181 may rest near the circuit board 102, and may thus define a bottom 186 of the receptacle assembly 104. In alternative embodiments, the circuit board 102 may define the bottom as opposed to using the base panel 181. The sidewalls 182, 183 and the back wall 184 are configured to extend from the circuit board 102, when mounted thereto, to the top wall 180.

The top wall 180 includes a plurality of apertures 190 therethrough. Portions of the heat exchangers 150 pass through the top wall 180 to the exterior of the module cavity 120 through the apertures 190. The apertures 190 are defined by aperture edges 192. The top wall 180 includes webbing 194 between the apertures 190. The webbing 194 defines a structure over the module cavities 122. For example, the webbing 194 covers the pluggable module 106 and the heat exchanger 150. The heat exchanger 150 is captured in the module cavity 122 by the webbing 194 of the top wall 180. The webbing 194 defines the size and shape of the apertures 190. The webbing 194 includes slats 196 and cross-slats 198 between the slats 196. In the illustrated embodiment, the slats 196 and the cross-slats 198 are oriented generally perpendicular, with the slats 196 extend longitudinally, such as parallel to the insertion axis 91, and the cross-slats 198 extend laterally, such as parallel to the lateral axis 93. The slats 196 and the cross-slats 198 define rectangular shaped apertures 190; however, the apertures 190 may have other shapes in alternative embodiments, such as elliptical shapes.

The interior panels 174 and the separator panels 176 are disposed within the housing cavity 172. Within the main panel 170, the interior panels 174 and the separator panels 176 apportion or divide the housing cavity 172 into the separate module cavities 120, 122.

The main panel 170, the base panel 181, the interior panels 174, and the separator panels 176 may comprise conductive material, such as metal or plastic. When the receptacle housing 108 is mounted to the circuit board 102, the receptacle housing 108 and the receptacle assembly 104 are electrically coupled to the circuit board 102 and, in particular, to ground planes (not shown) within the circuit board 102 to electrically ground the receptacle housing 108 and the receptacle assembly 104. As such, the receptacle assembly 104 may reduce EMI leakage that may negatively affect electrical performance of the communication system 100.

FIG. 3 is a front perspective view of the pluggable module 106 in accordance with an exemplary embodiment. The pluggable module 106 is illustrated as a finned pluggable module and may be referred to hereinafter as finned pluggable module 106. The pluggable body 130 holds the internal circuit board 138. The pluggable body 130 has a first end or top end 200 and an opposite second end or bottom end 202 with sides 204, 206 extending between the first and second ends 200, 202. The first and second ends 200, 202 and the sides 204, 206 extend lengthwise along a length of the pluggable body 130 between the mating end 132 and cable end 134. The first end 200, second end 202 and sides 204, 206 define a cavity 210 that holds the internal circuit board 138. The cable 136 may extend into the cavity 210 for connection with the internal circuit board 138. Optionally, the internal circuit board 138 may be exposed at the mating end 132 for mating with the corresponding communication connector 142 (shown in FIG. 2).

In an exemplary embodiment, the pluggable body 130 includes a first shell 212 and a second shell 214. Optionally, the first shell 212 may define an upper shell and may be referred to hereinafter as upper shell 212. The second shell 214 may define a lower shell and be referred to hereinafter as lower shell 214. The upper shell 212 and/or the lower shell 214 are fabricated from a material having a high thermal conductivity. In an exemplary embodiment, the upper shell 212 is used for heat transfer from the internal circuit board 138. The upper shell 212 is placed in thermal communication with the internal circuit board 138. Heat generated by components on the internal circuit board 138 is drawn into the upper shell 212 and transferred therefrom. In an exemplary embodiment, the upper shell 212 includes a plurality of heat transfer fins 220 extending therefrom. The heat transfer fins 220 increase the surface area of the upper shell 212 and allow greater heat transfer from the upper shell 212. The heat transfer fins 220 may engage corresponding rails 164 (shown in FIG. 1) of the heat exchanger 150 (shown in FIG. 1). For example, the rails 164 may be interleaved with the heat transfer fins 220. The heat transfer fins 220 may extend from any portion of the upper shell 212, such as the top or first end 200; however the heat transfer fins 220 may extend from the sides 204, 206.

The heat transfer fins 220 run lengthwise between the cable end 134 and the mating end 132. Optionally, the heat transfer fins 220 may run substantially the entire length from the cable end 134 to the mating end 132. Optionally, the heat transfer fins 220 may be recessed inward from the cable end 134 and/or the mating end 132. In the illustrated embodiment, the heat transfer fins 220 are parallel plates that extend continuously between opposite ends of the heat transfer fins 220. The heat transfer fins 220 are separated by channels 222. Optionally, the channels 222 may have a uniform spacing between the heat transfer fins 220. For example, sides of the heat transfer fins 220 may be planar and parallel.

Figure 4:
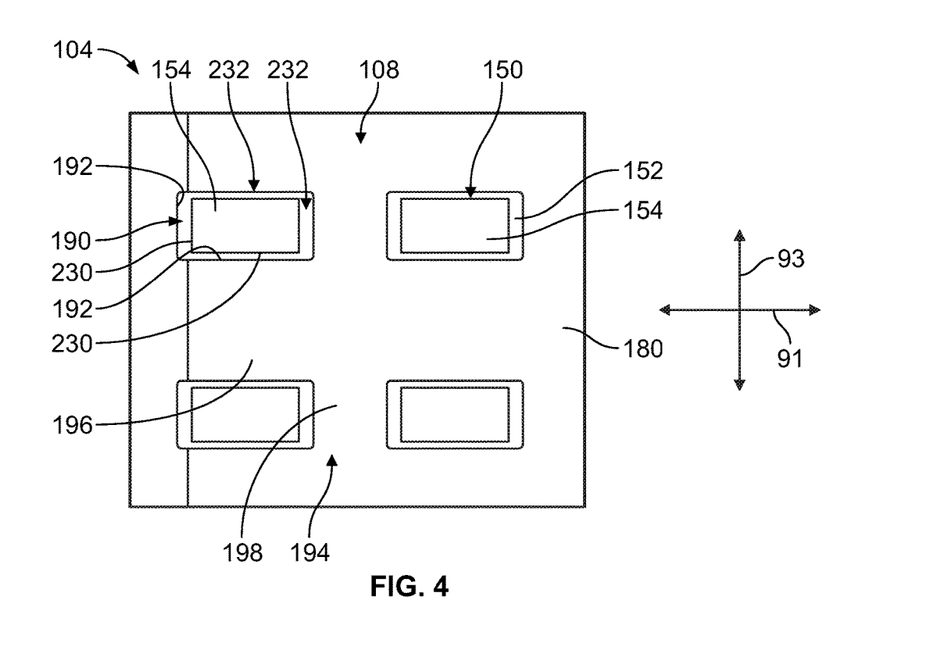
FIG. 4 is a top view of a portion of the receptacle assembly in accordance with an exemplary embodiment.

FIG. 4 is a top view of a portion of the receptacle assembly 104 in accordance with an exemplary embodiment. The heat spreader 152 is disposed below the webbing 194 and the fin segments 154 extend through the apertures 190. The fin segments 154 have sides 230, which may be orthogonal to each other. The sides 230 face the aperture edges 192, such as the aperture edges 192 defined by both the slats 196 and the cross-slats 198. In an exemplary embodiment, gaps 232 are defined between the sides 230 and the aperture edges 192. The heat spreader 152 is positioned below the gaps 232, which may provide EMI shielding for the gaps 232. The heat spreader 152 is also positioned below the webbing 194. The sizes of the apertures affect EMI shielding by the top wall 180. For example, smaller apertures may provide more efficient EMI shielding. Smaller apertures may provide EMI shielding for higher frequencies and/or a larger band of frequencies.

The apertures 190 may be oversized relative to the fin segments 154 to allow the fin segments 154 to move within the apertures 190. Optionally, the gaps 232 are provided on at least two of the sides 230 of the fin segments 154, such as along all four sides 230, to allow movement in mutually perpendicular directions. For example, the fin segments 154 may be allowed to move longitudinally, such as parallel to the insertion axis 91 (for example, front-to-back), and/or may be allowed to move laterally, such as parallel to the lateral axis 93 (for example, side-to-side).

The aperture edges 192 define stops to limit the amount of floating movement of the fin segments 154 in the apertures 190. Allowing the fin segments 154 to move within the apertures 190 allows the heat exchanger 150 to move relative to the receptacle housing 108. As such, the heat exchanger 150 may be allowed to move for mating with the pluggable module 106 (shown in FIG. 1). For example, when the pluggable module 106 is loaded into the receptacle housing 108, the heat exchanger 150 may be shifted (for example, side-to-side) to align with the pluggable module 106. As such, the heat exchanger 150 does not restrict positioning of the pluggable module 106 in the receptacle housing 108, such as for mating with the communication connector 142.

Figure 5:
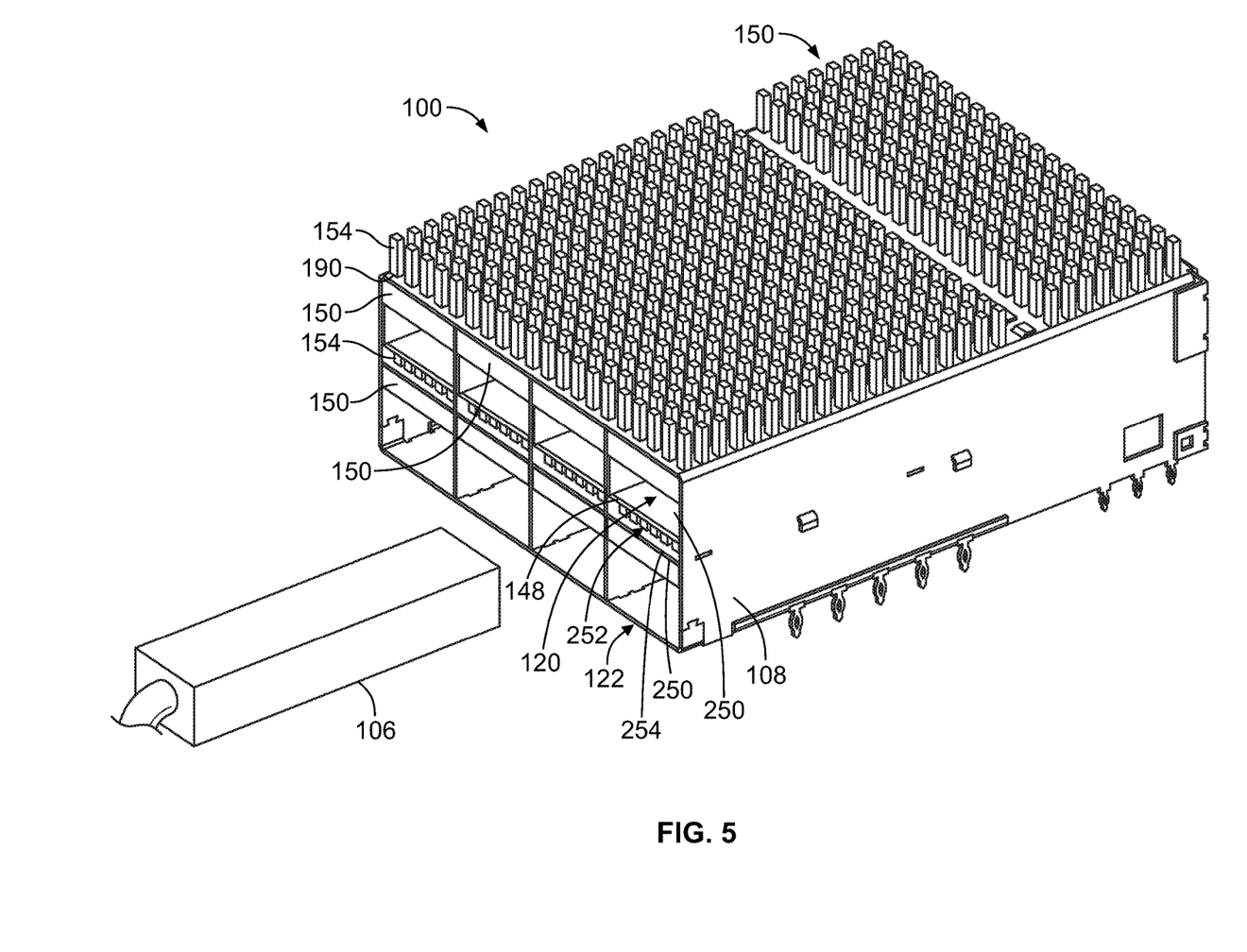
FIG. 5 is a front perspective view of the communication system in accordance with an embodiment.

FIG. 5 is a front perspective view of the communication system 100 in accordance with an embodiment showing the pluggable module 106 having a generally flat top and the heat exchanger 150 having a generally flat bottom to interface with the pluggable module 106. The pluggable module 106 does not include the heat transfer fins and the heat exchanger 150 does not include the rails 164 (shown in FIG. 1). Because the heat exchanger 150 does not include the rails 164, the heat exchanger 150 does not need to align to the pluggable module 106 side-to-side. As such, the amount of floating movement side-to-side of the heat exchanger 150 may be less than the heat exchanger 150 shown in FIG. 1. The apertures 190 may be smaller because the heat exchanger 150 does not need to float as far or at all. Providing smaller apertures 190 reduces the size of the gaps between the fin segments 154 and the receptacle housing 108, and provides better EMI shielding as compared to the embodiment shown in FIG. 1. However, the amount of surface area between the heat exchanger 150 and the pluggable module 106 may be less as compared to the embodiment shown in FIG. 1, which may reduce the heat transfer efficiency.

In the illustrated embodiment, the port separator 148 is shown as being U-shaped having two separating walls 250 separated by a gap 252 between the upper and lower module cavities 120, 122. A second heat exchanger 150 is configured to be received in the lower module cavity 122 with the fin segments 154 extending into the gap 252, such as through the lower separating wall 250. The lower separating wall 250 defines a top wall 254 of the lower module cavity 122. The fin segments 154 are received in corresponding apertures in the top wall 254 to pass through the top wall 254 to an exterior of the module cavity 122 (for example, into the gap 252) for heat dissipation. For example, air may pass through the gap 252 to cool the fin segments 154.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle assembly comprising:
   a receptacle housing comprising a module cavity defined by a top wall and opposed side walls extending to a bottom opposite the top wall, the top wall having a plurality of apertures therethrough defined by aperture edges, the top wall includes webbing between the apertures including slats and cross-slats between the apertures in rows and columns, respectively, the module cavity having a port at a front end of the receptacle housing configured to receive a pluggable module;
   a communication connector positioned in the receptacle housing having a mating interface for mating with the pluggable module; and
   a heat exchanger received in the module cavity, the heat exchanger having a heat spreader positioned interior of the module cavity below the top wall, the heat spreader configured to be in thermal communication with the pluggable module, the heat exchanger having a plurality of fin segments extending from the heat spreader, the fin segments received in corresponding apertures in the top wall to pass through the top wall to an exterior of the module cavity for heat dissipation.

2. The receptacle assembly of claim 1, wherein the apertures are oversized relative to the fin segments to allow a limited amount of floating movement of the heat exchanger relative to the receptacle housing.

3. The receptacle assembly of claim 1, wherein the apertures are sized to restrict EMI leakage through the top wall.

4. The receptacle assembly of claim 1, wherein each fin segment is separated from each other fin segment by a portion of the top wall.

5. The receptacle assembly of claim 1, wherein each aperture receives a single one of the fin segments.

6. The receptacle assembly of claim 1, wherein the heat exchanger is captured in the module cavity by the top wall.

7. The receptacle assembly of claim 1, wherein the apertures receive the fin segments such that gaps are defined between the fin segments and the aperture edges, the heat spreader is positioned below the gaps.

8. The receptacle assembly of claim 1, wherein the apertures receive the fin segments such that gaps are defined between the fin segments and the aperture edges, the gaps are provided on at least two sides of the corresponding fin segments to allow movement in mutually perpendicular directions.

9. The receptacle assembly of claim 1, wherein the heat spreader is positioned between the top wall and the pluggable module.

10. The receptacle assembly of claim 1, wherein the receptacle housing includes a port separator between the module cavity and a second module cavity, the port separator having separating walls separated by a gap, one of the separating walls defining the top wall of the module cavity, the fin segments extending exterior of the module cavity into the gap of the port separator.

11. The receptacle assembly of claim 1, wherein the heat exchanger includes rails extending from the heat spreader opposite the fin segments, the rails being configured to be interleaved with heat transfer fins of the pluggable module.

12. The receptacle assembly of claim 1, wherein the webbing capturing the heat spreader in the module cavity.

13. The receptacle assembly of claim 1, further comprising a second heat exchanger received in the receptacle housing being independently moveable relative to the other heat exchanger.

14. The receptacle assembly of claim 13, wherein the apertures are provided in at least two different arrays, the arrays of apertures receiving different heat exchangers.

15. The receptacle assembly of claim 1, wherein each fin segment includes a base at the heat spreader and a tip opposite the base, the base being provided interior of the module cavity, the tip being provided exterior of the module cavity.

16. A receptacle assembly comprising:
a receptacle housing comprising first and second module cavities defined by a top wall and separated by a dividing wall, the top wall having a plurality of apertures therethrough defined by aperture edges, the first and second module cavities having ports at a front end of the receptacle housing configured to receive corresponding pluggable modules; and
first and second heat exchangers received in the first and second module cavities, respectively, each of the first and second heat exchangers having a heat spreader positioned interior of the corresponding module cavity and configured to be in thermal communication with the corresponding pluggable module, each of the first and second heat exchangers having a plurality of fin segments extending from the heat spreader, the fin segments received in corresponding apertures in the top wall to pass through the top wall to an exterior of the corresponding module cavity for heat dissipation, the apertures being oversized relative to the fin segments to allow a limited amount of floating movement of the first and second heat exchangers relative to the receptacle housing such that the first and second heat exchangers are movable independent relative to each other.

17. The receptacle assembly of claim 16, wherein the apertures receive the fin segments such that gaps are defined between the fin segments and the aperture edges.

18. The receptacle assembly of claim 16, wherein each fin segment is separated from each other fin segment by a portion of the top wall.

19. A communication system comprising:
a pluggable module having a pluggable body extending between a mating end and a cable end, the pluggable module having a circuit card at the mating end, the pluggable body being thermally conductive and in thermal communication with the circuit card to dissipate heat from the circuit card;
a receptacle assembly receiving the pluggable module, the receptacle assembly comprising a receptacle housing holding a communication connector for mating with the pluggable module, the receptacle housing having a top wall and side walls extending to a bottom of the receptacle housing opposite the top wall, the top wall and the side walls being integral and seamless with the side walls being bent perpendicular from the top wall, the receptacle housing having a module cavity defined by the top wall, the top wall having a plurality of apertures therethrough defined by aperture edges, the module cavity having a port at a front end of the receptacle housing receiving the pluggable module; and
a heat exchanger received in the module cavity through the port and being aligned with the top wall, the heat exchanger having a heat spreader positioned interior of the module cavity, the heat spreader being in thermal communication with the pluggable module, the heat exchanger having a plurality of fin segments extending from the heat spreader, the fin segments being loaded into corresponding apertures in the top wall from below in the module cavity to pass through the top wall to an exterior of the module cavity for heat dissipation, the apertures receiving the fin segments such that gaps are defined between the fin segments and the aperture edges.

20. The communication system of claim 19, wherein the top wall includes webbing between the apertures, the webbing including slats and cross-slats between the apertures in rows and columns, respectively.

* * * * *